United States Patent
Ha et al.

(10) Patent No.: US 8,351,274 B2
(45) Date of Patent: Jan. 8, 2013

(54) SEMICONDUCTOR MEMORY DEVICE AND METHOD OF PRECHARGING THE SAME WITH A FIRST AND SECOND PRECHARGE VOLTAGE SIMULTANEOUSLY APPLIED TO A BIT LINE

(75) Inventors: Sung Joo Ha, Gyeonggi-do (KR); Young Soo Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 212 days.

(21) Appl. No.: 12/981,927

(22) Filed: Dec. 30, 2010

(65) Prior Publication Data

US 2011/0158002 A1    Jun. 30, 2011

(30) Foreign Application Priority Data

Dec. 31, 2009  (KR) .................. 10-2009-0135613

(51) Int. Cl.
*G11C 16/24*   (2006.01)
(52) U.S. Cl. ......... 365/185.25; 365/185.17; 365/185.18; 365/185.22; 365/185.11
(58) Field of Classification Search ............. 365/185.17, 365/185.23, 185.25, 185.18, 185.22, 185.11, 365/185.16
See application file for complete search history.

(56) References Cited

U.S. PATENT DOCUMENTS

| 7,379,337 B2 * | 5/2008 | Park ................. 365/185.18 |
| 2011/0158002 A1 * | 6/2011 | Ha et al. ............. 365/185.25 |

FOREIGN PATENT DOCUMENTS

| KR | 1020080102037 | 11/2008 |
| KR | 1020090096879 | 9/2009 |

OTHER PUBLICATIONS

Notice of Preliminary Rejection issued from Korean Intellectual Property Office on Mar. 9, 2011.

* cited by examiner

*Primary Examiner* — Andrew Q Tran
(74) *Attorney, Agent, or Firm* — IP & T Group LLP

(57) ABSTRACT

A semiconductor memory device includes a memory string coupled between a common source line and a bit line, a page buffer configured to supply a first precharge voltage to the bit line and to latch data corresponding to a threshold voltage level of a memory cell of the memory string, wherein the data is detected according to a shift in a voltage of the bit line, in a precharge operation, a precharge circuit configured to supply a second precharge voltage to the common source line in the precharge operation, and a voltage supply circuit configured to generate operating voltages for turning on the memory string in the precharge operation. While the first precharge voltage is supplied from the page buffer to the bit line, the second precharge voltage is supplied to the bit line through the memory string.

18 Claims, 3 Drawing Sheets

SEMICONDUCTOR MEMORY DEVICE AND METHOD OF PRECHARGING THE SAME WITH A FIRST AND SECOND PRECHARGE VOLTAGE SIMULTANEOUSLY APPLIED TO A BIT LINE

CROSS-REFERENCE TO RELATED APPLICATION

Priority to Korean patent application number 10-2009-0135613 filed on Dec. 31, 2009, the entire disclosure of which is incorporated by reference herein, is claimed.

BACKGROUND

Exemplary embodiments relate to a semiconductor memory device and a method of operating the same and, more particularly, to a semiconductor memory device and a method of operating the same, which are capable of improving the operating speed.

The memory cells of a DRAM or flash memory device are often coupled to a sense amplifier or a page buffer for storing or sensing data through a bit line. As an example of a DRAM memory device, a NAND flash memory device is described below in detail.

In FIG. 1, for a NAND flash memory device according to an example, a memory array includes 1024 to 4096 memory blocks. Each of the memory blocks includes a plurality of strings. Each of the strings includes a drain select transistor coupled to a bit line, a source select transistor coupled to a common source line, and memory cells coupled in series between the drain select transistor and the source select transistor. In each memory block, the strings placed in the same column are coupled to the page buffer through one bit line.

In order for one bit line to couple the strings of the same column in all memory blocks to the page buffer as described above, the length of the bit line becomes long.

In an operation of reading data stored in a memory cell or a verification operation of detecting the threshold voltage of the memory cell, a step of precharging a bit line is performed. With an increase of the length of the bit line, the time taken to precharge the bit line may be increased. Accordingly, the entire operation time may be longer.

BRIEF SUMMARY

In accordance with exemplary embodiments, the operating speed can be improved by reducing the time taken to precharge the bit line.

A semiconductor memory device according to an aspect of this disclosure includes a memory string coupled between a common source line and a bit line, a page buffer configured to supply a first precharge voltage to the bit line in a precharge operation and to latch data corresponding to a threshold voltage level of a memory cell of the memory string, wherein the data is detected according to a shift in a voltage of the bit line, a precharge circuit configured to supply a second precharge voltage to the common source line in the precharge operation, and a voltage supply circuit configured to generate operating voltages for turning on the memory string in the precharge operation. While the first precharge voltage is supplied from the page buffer to the bit line, the second precharge voltage is supplied to the bit line through the memory string.

A method of operating a semiconductor memory device according to yet another aspect of this disclosure includes precharging a bit line by supplying a first precharge voltage to the bit line and supplying a second precharge voltage to a common source line so that the second precharge voltage is supplied to the bit line through a memory string, supplying operating voltages to the memory string, and sensing the operating voltages and a voltage of the bit line, wherein the voltage is changed according to a threshold voltage of a memory cell included in the memory string.

A semiconductor memory device still yet another aspect of this disclosure includes a memory string coupled between a common source line and a bit line and a precharge circuit configured to precharge the bit line by simultaneously supplying a first precharge voltage to the bit line through a page buffer for detecting a shift in a voltage of the bit line and a second precharge voltage to the bit line through the common source line and the memory string, during a precharge operation.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
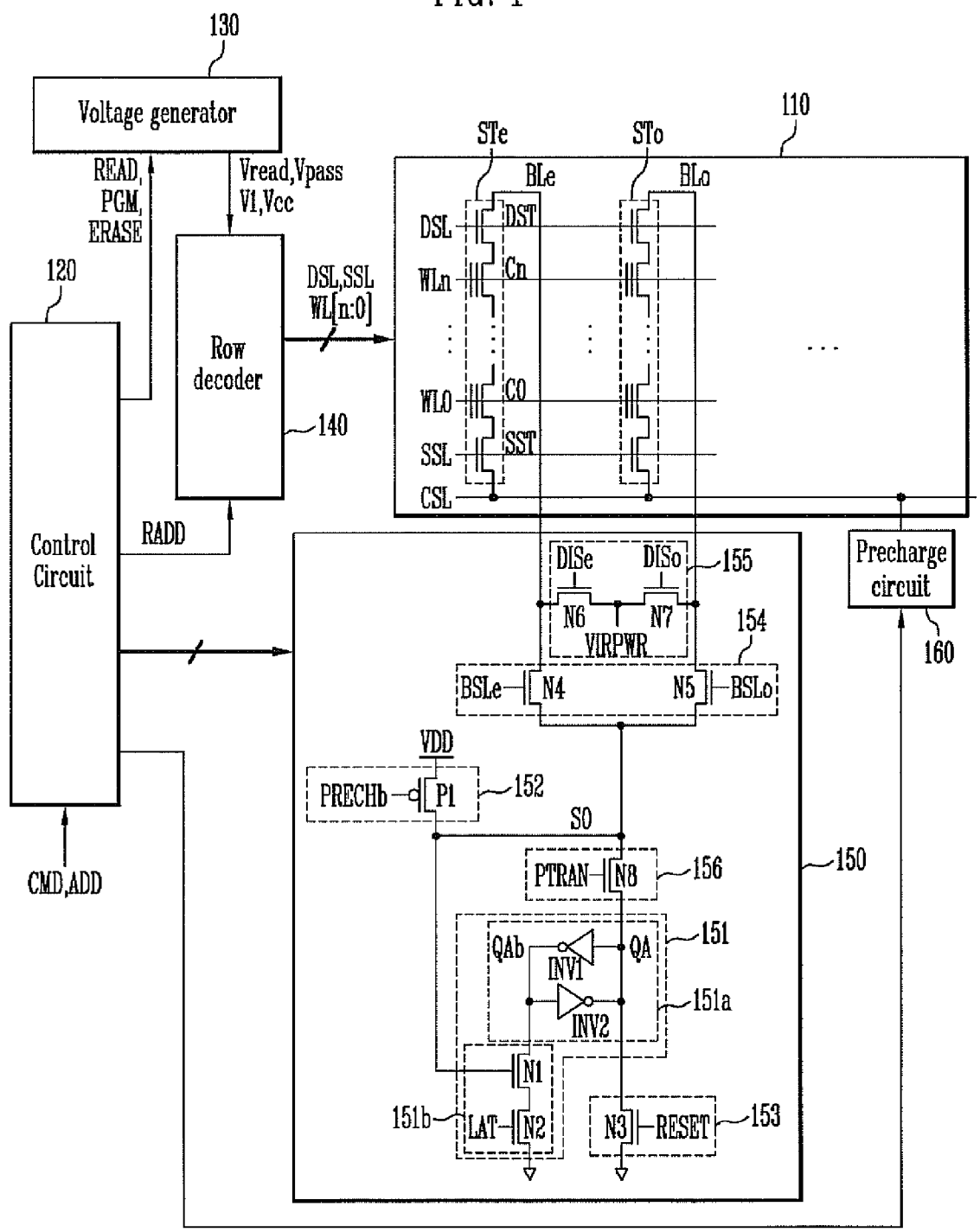
FIG. 1 is a diagram illustrating a semiconductor memory device according to an exemplary embodiment of this disclosure.

FIG. 1 is a diagram illustrating a semiconductor memory device according to an exemplary embodiment of this disclosure.

Referring to FIG. 1, the semiconductor memory device includes a memory array 110, a control circuit 120, a voltage supply circuit, a page buffer 150, and a precharge circuit 160.

The memory array 110 includes a plurality of memory blocks. Each of the memory blocks includes memory strings STe, STo coupled to bit lines BLe, BLo, respectively, and coupled in parallel to a common source line CSL. Only two memory strings STe, STo included in one memory block are shown for illustration purposes. The memory string STe includes a drain select transistor DST, memory cells Co to Cn, and a source select transistor SST which are coupled in series between the bit line BLe and the common source line CSL. More particularly, the drain select transistor DST is coupled to the bit line BLe and configured to operate according to a voltage supplied to the drain select line DSL. The memory cells C0 to Cn are operated according to voltages supplied to word lines WL0 to WLn. The source select transistor SST is operated according to a voltage supplied to a source select line SSL.

The control circuit 120 internally outputs a program operation signal PGM, a read operation signal READ, or an erase operation signal ERASE in response to a command signal CMD and outputs control signals (for example, PRECHb, PTRAN, LAT, RESET, BSLe, BSLo, DISe, and DISo) for controlling internal circuits, such as the page buffer 150, according to the type/mode of an operation. Furthermore, the control circuit 120 internally outputs a row address signal RADD and a column address signal (not shown) in response to an address signal ADD.

The voltage supply circuit supplies operating voltages for the program, erase, or read operation of memory cells to the strings of a selected memory block in response to the signals READ, PGM, ERASE, and RADD of the control circuit 120. The voltage supply circuit includes a voltage generation circuit 130 and a row decoder 140, which are described in detail below.

The voltage generation circuit 130 outputs the operating voltages (for example, Vread, Vpass, V1, and Vcc) for programming, reading, or erasing memory cells to global lines, in response to the operating signals PGM, READ, and ERASE which are the internal command signals of the control circuit 120.

The row decoder 140 transfers operating voltages, generated by the voltage generation circuit 130, to the strings STe, STo of a memory block selected from among the memory blocks of the memory array 110, in response to the row address signal RADD of the control circuit 120. That is, the operating voltages are supplied to the lines DSL, WL[n:0], and SSL of the selected memory block.

The page buffer 150 is coupled to the bit line BLe and configured to a supply voltage for storing data in a memory cell to the bit line BLe in response to the control signals of the control circuit 120. More particularly, the page buffer 150 precharges the bit line BLe in a precharge operation for the program, erase, or read operation of a memory cell or latches data corresponding to a threshold voltage level of a memory cell, detected according to a shift in the voltage of the bit line BLe. That is, the page buffer 150 controls a voltage of the bit line BLe which indicates data stored in a memory cell and detects data stored in a memory cell. A detailed construction and operation of the page buffer 150 are described below.

The page buffer 150 includes a latch circuit 151, a precharge circuit 152, a reset circuit 153, a bit line coupling circuit 154, a discharge circuit 155, and a transmission circuit 156.

The discharge circuit 155 includes switching elements N6, N7 for coupling the respective bit lines BLe, BLo to a virtual voltage source VIRPWR in response to respective signals DISe, DISo. The discharge circuit 155 can precharge or discharge both the bit lines BLe, BLo by turning on both the switching elements N6, N7 or can precharge or discharge only one of the bit lines BLe, BLo by turning on only one of the switching elements N6, N7.

The bit line coupling circuit 154 includes a switching element N4 and a switching element N5. The switching element N4 couples the even bit line BLe and a sense node SO in response to a bit line select signal BSLe. The switching element N5 couples the odd bit line BLo and the sense node SO in response to a bit line select signal BSLo. The bit line coupling circuit 154 couples one of the pair of bit lines BLe, BLo to the sense node SO in response to the bit line select signals BSLe, BSLo.

The precharge circuit 152 includes a switching element P1 coupled between a power supply voltage terminal VDD and the sense node SO and operated in response to a precharge signal PRECHb. The precharge circuit 151 precharges the sense node SO in response to the precharge signal PRECHb. Here, the sense node SO can be precharged to the VDD level. However, if the bit line select signal BSLe of a V1 level is supplied to the switching element N4 of the bit line coupling circuit 154, a first precharge voltage of a first level V1-Vth (where Vth is a threshold voltage of the switching element N4) is supplied to the bit line BLe.

The latch circuit 151 includes a latch 151a and a sense circuit 151b. The latch 151a latches data to be stored in a memory cell or latches data stored in a memory cell.

The sense circuit 151b includes switching elements N1, N2 coupled in series between a ground terminal and the second input terminal QAb of the latch 151a. The switching element N1 is operated according to a voltage level of the sense node SO, and the switching element N2 is operated in response to a latch signal LAT. More specifically, the sense circuit 151b changes data stored in the latch 151a in response to the latch signal LAT and a voltage level of the sense node SO.

The reset circuit 153 includes a switching element N3 coupled between the ground terminal and the first input terminal QA of the latch 151a and operated in response to a reset signal RESET. The reset circuit 153 performs an operation of resetting data, stored in the latch 151a, to a state '0' according to data stored in the reset signal RESET.

The transmission circuit 156 includes a switching element N8 coupled between the sense node SO and the first input terminal QA of the latch 151a and operated response to a transmission signal PTRAN. The transmission circuit 156 performs an operation of transferring a voltage, corresponding to data latched in the latch 151a, to the bit line BLe in order to store data in a memory cell when the program operation of the memory cell is performed.

The precharge circuit 160 outputs a second precharge voltage to be supplied to the bit line BLe via string STe during the precharge operation of the bit line. During the precharge operation, the page buffer 150 can supply a first precharge voltage to one end of the bit line BLe, and the second precharge voltage of the precharge circuit 160 can be supplied to the other end (for example, a node of the drain select transistor DST and the bit line BLe) of the bit line BLe. This is described in more detail below.

During a bit line precharge operation, the precharge circuit 160 generates the second precharge voltage and outputs the second precharge voltage to the common source line CSL, under the control of the control circuit 120. The voltage supply circuit 130, 140 turns on all the elements DST, C0 to Cn, and SST included in the memory strings STe, STo under the control of the control circuit 120. The second precharge voltage of the precharge circuit 160 is transferred to the bit lines BLe, BLo through the memory strings STe, STo. Thus, the bit lines BLe, BLo are each precharged by the first and second precharge voltages supplied to its two ends by the page buffer 150 and the precharge circuit 160, respectively. Since the bit line BLe is precharged by the first and second precharge voltages supplied to its two ends, the time that it takes to perform the precharge operation can be reduced even if the length of the bit line BLe is relatively long. Consequently, the time that it takes to perform the entire program, erase, or read operation can be reduced.

Meanwhile, during the precharge operation, the page buffer 150 supplies the first precharge voltage of the first level V1-Vth (where Vth is a threshold voltage of the switching element N4) to the bit line BLe. The precharge circuit 160 outputs the second precharge voltage (for example, VDD) having a higher level than the first level V1. Operating voltages supplied to the string STe are controlled so that the second precharge voltage received at one end of the string Ste is lowered through the string STe. For example, when the operating voltage of the V1 level is supplied to the select line DSL or SSL, the second precharge voltage of the second level VDD is lowered to the first level V1-Vth and supplied to the bit line BLe.

The reason why the precharge circuit 160 generates the second precharge voltage having the second level (e.g., VDD) higher than the first level V1-Vth is to prevent the second precharge voltage from becoming lower than the first level while passing through a memory string. Furthermore, the reason why the second level (e.g., VDD) of the second precharge voltage is lowered up to the first level V1-Vth is to correctly control the level of the precharge voltage at the bit line BLe.

The semiconductor memory device constructed as above is described below. The precharge circuit 160 can perform an operation of precharging the bit line BLe. In some embodiments, the precharge circuit 152 can perform an operation of precharging the bit line BLe. Here, the precharge circuit 152 becomes a first precharge circuit for supplying a precharge voltage to one end of the bit line BLe, and the precharge circuit 160 becomes a second precharge circuit for supplying a precharge voltage to the other end of the bit line BLe.

A method of operating the semiconductor memory device constructed as above is described below.

Figure 2:
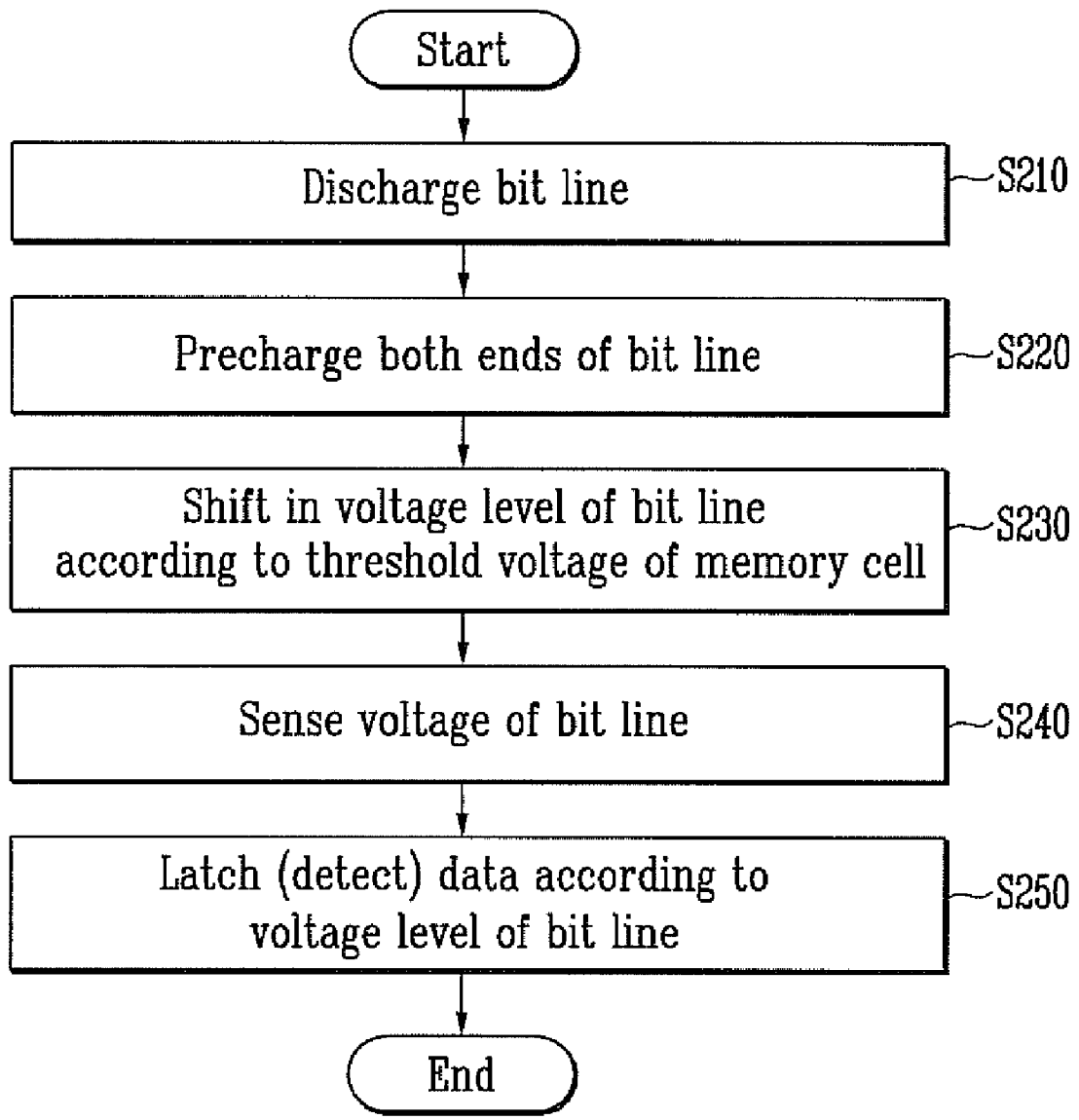
FIG. 2 is a flowchart illustrating a method of operating the semiconductor memory device according to an exemplary embodiment of this disclosure.
Figure 3:
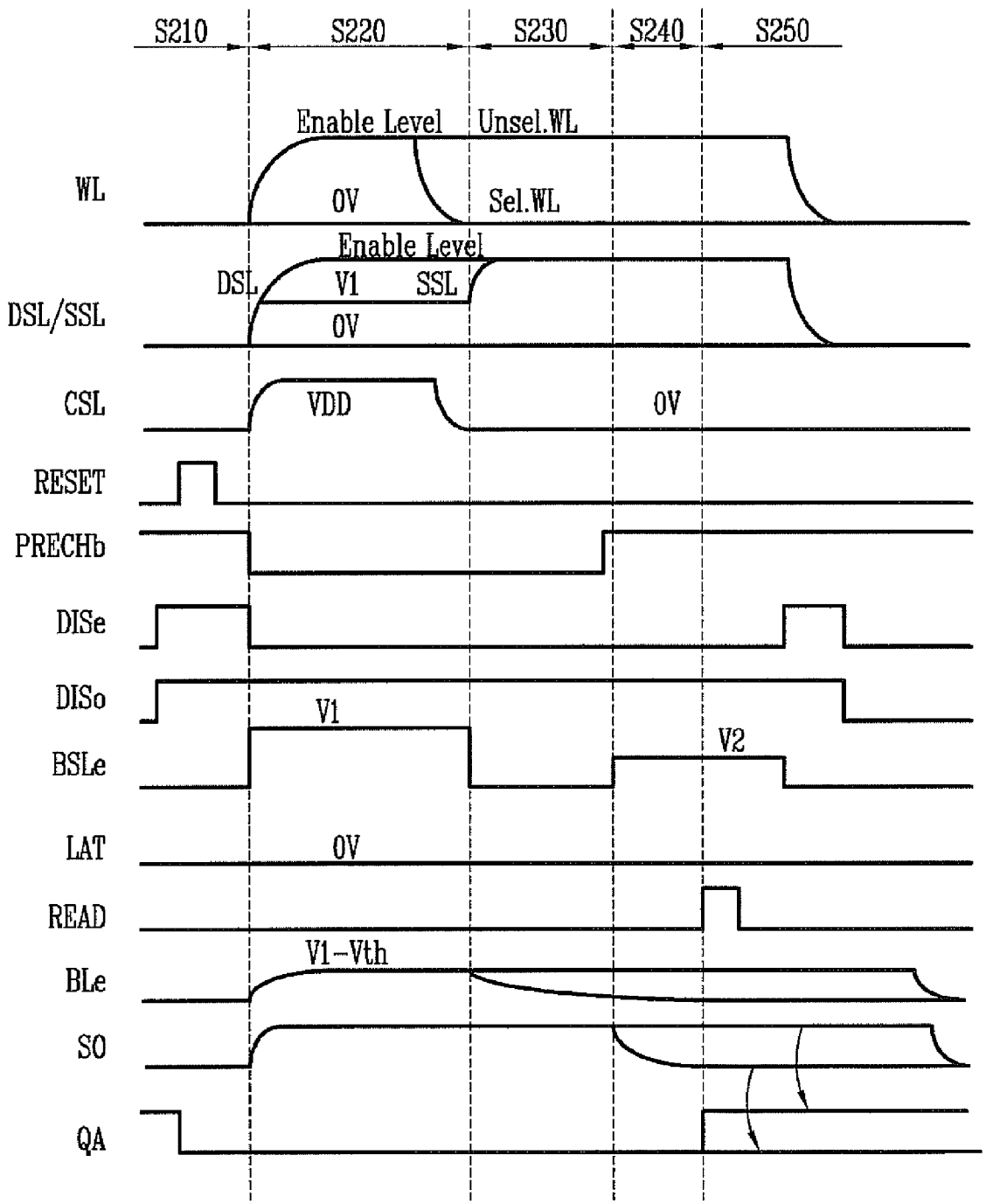
FIG. 3 is a waveform illustrating the method of operating the semiconductor memory device according to an exemplary embodiment of this disclosure.

FIG. 2 is a flowchart illustrating a method of operating the semiconductor memory device according to an exemplary embodiment of this disclosure. FIG. 3 is a waveform illustrating the method of operating the semiconductor memory device according to an exemplary embodiment of this disclosure.

Referring to FIGS. 1, 2, and 3, at a first step S210, the bit lines BLe, BLo are discharged. To this end, the virtual voltage source VIRPWR supplies the ground voltage, and the switching elements N6, N7 of the discharge circuit 155 are turned on in response to the signals DISe, DISo. Thus, the bit lines BLe, BLo are discharged. Meanwhile, the latch 151a is also reset. The switching element N3 of the reset circuit 153 is turned on in response to the reset signal RESET, and the first input terminal QA of the latch 151a is coupled to the ground terminal. Consequently, the latch 151a becomes a reset state in which data '0' is stored.

At a second step S220, a precharge operation is performed on a selected bit line (for example, BLe). To this end, the precharge circuit 152 and the bit line select circuit 154 of the page buffer 150, playing the role of a first precharge circuit, are operated in response to the precharge signal PRECHb and the bit line select signal BSLe, and so the first precharge voltage is supplied to one end of the bit line BLe. Further, the precharge circuit 160 is operated, and so the second precharge voltage is supplied to the common source line CSL. In order for the second precharge voltage to be supplied to the other end of the bit line BLe through a memory string STe, the voltage supply circuit 130, 140 supplies an operating voltage for turning on the memory string STe. More specifically, the voltage supply circuit 130, 140 supplies voltage of 4.5 V to 8 V to the word lines WL[n:0] and the drain select line DSL, thereby turning on the memory cells C0 to Cn and the drain select transistor DST of the memory string STe. Meanwhile, voltage V1 of a different level is supplied to the source select line SSL of the memory string Ste. Consequently, the second precharge voltage which is received and reduced through the memory string Ste to equal the first precharge voltage is supplied to the bit line BLe through the memory string STe. Since the first and second precharge voltages are supplied to one and other ends of the bit line BLe at the same time as described above, the time that it takes to precharge the bit line BLe can be reduced.

At a third step S230, operating voltages are supplied to the memory string STe. For example, a voltage for turning on the select transistors DST, SST can be supplied to the select lines DSL, SSL. A read voltage (for example, 0 V) is supplied to a selected word line, and a read pass voltage of 4.5 V to 8 V for turning on unselected memory cells is supplied to the unselected word lines. At this time, the precharge circuit 160 no longer outputs the precharge voltage. Furthermore, the precharge operation of the page buffer 150 is stopped. Further, the common source line CSL is coupled to the ground terminal. Consequently, when a threshold voltage of the selected memory cell is less than the read voltage, a current path from the bit line BLe to the common source line CSL is formed. Thus, voltage of the bit line BLe is lowered. When a threshold voltage of the selected memory cell is higher than the read voltage, a voltage of the bit line BLe remains unchanged.

At a fourth step S240, voltages for sensing a shift in the voltage of the bit line BLe are supplied. For example, the precharge circuit 152 is switched off, and a coupling voltage V2 can be supplied to the switching element N4 of the bit line coupling circuit 154. The coupling voltage V2 is supplied with an appropriate voltage level so that the switching element N4 is turned based on the detected voltage level of the bit line BLe and a voltage level of the sense node SO in the precharge state. More specifically, when a voltage of the bit line BLe is lowered, the switching element N4 is turned on, and so voltage of the sense node SO is also lowered. However, when voltage of the bit line BLe remains unchanged without being lowered, the switching element N4 is turned off and so voltage of the sense node SO does not shift/change.

At a fifth step S250, data corresponding to a threshold voltage of a memory cell is latched according to a voltage level of the bit line BLe (that is, a voltage level of the sense node SO). For example, when the latch signal LAT is supplied, the switching element N2 of the sense circuit 151b is turned on. Further, whether the switching element N1 of the sense circuit 151b will be turned on is determined according to a voltage level of the sense node SO. More specifically, in case where a threshold voltage of the memory cell is higher than the read voltage and so a voltage level of the sense node SO remains unchanged, the switching element N2 is turned on. Consequently, the second input terminal QAb of the latch 151a is coupled to the ground terminal, and so the data stored in the latch 151a is changed to '1'. Meanwhile, in case where a threshold voltage of the memory cell is lower than the read voltage and so a voltage level of the sense node SO is lowered, the switching element N2 is turned off. Consequently, the data stored in the latch 151a is not changed.

A bit line precharge method in a read operation for reading data stored in a memory cell has been described above. However, the bit line precharge method can also be applied to a program method, a program verification method, an erase method, or an erase verification method.

In accordance with the embodiments of this document, the time that it takes to precharge a bit line is reduced. Accordingly, an operating time for all operations, including a program operation, a read operation, an erase operation, and so on can be reduced.

What is claimed is:

1. A semiconductor memory device, comprising:
   a memory string coupled between a common source line and a bit line;
   a page buffer configured to supply a first precharge voltage to the bit line in a precharge operation and to latch data corresponding to a threshold voltage level of a memory cell of the memory string, wherein the data is detected according to a shift in a voltage of the bit line;
   a precharge circuit configured to supply a second precharge voltage to the common source line in the precharge operation; and
   a voltage supply circuit configured to generate operating voltages for turning on the memory string in the precharge operation,
   wherein the second precharge voltage is supplied to the bit line through the memory string while the first precharge voltage is supplied from the page buffer to the bit line.

2. The semiconductor memory device of claim 1, wherein the precharge circuit is configured to output the second precharge voltage during a precharge operation in which the page buffer precharges the bit line.

3. The semiconductor memory device of claim 1, wherein the precharge circuit is configured to output the second precharge voltage during a precharge operation of the bit line performed for a program verification operation of the memory cell, a precharge operation of the bit line performed for a read operation of the memory cell, and a precharge operation of the bit line performed for an erase verification operation of the memory cell.

4. The semiconductor memory device of claim 1, wherein the precharge circuit is configured to output the second precharge voltage having a higher voltage level than the first precharge voltage of the page buffer.

5. The semiconductor memory device of claim 4, wherein the voltage supply circuit is configured to supply the operating voltages to the memory string so that the memory string decreases the second precharge voltage to output a voltage substantially similar with the first precharge voltage.

6. The semiconductor memory device of claim 1, wherein the memory string comprises a drain select transistor, memory cells, and a source select transistor coupled in series between the bit line and the common source line.

7. The semiconductor memory device of claim 6, wherein the voltage supply circuit is configured to apply an operating voltage to a gate of the source select transistor, wherein the operating voltage applied at the gate of the source select transistor is equal to the first precharge voltage.

8. The semiconductor memory device of claim 7, wherein the voltage supply circuit is configured to apply a read voltage to a selected memory cell of the memory string to detect a programmed state of the selected memory cell and apply a read pass voltage to remaining memory cells of the memory string after supplying the first and second precharge voltages.

9. The semiconductor memory device of claim 6, wherein the voltage supply circuit outputs first operating voltages for turning on memory cells of the memory string and the drain select transistor and a second operating voltage to be supplied to the source select transistor in order to control the second precharge voltage so that the second precharge voltage has the same voltage level with the first precharge voltage.

10. The semiconductor memory device of claim 1, wherein the voltage supply circuit comprises:
a voltage generation circuit configured to generate the operating voltages in response to an operation command signal; and
a row decoder configured to supply the operating voltages to a string of a memory block, selected from among a plurality of memory blocks, in response to a row address signal.

11. A method of operating a semiconductor memory device, comprising:
precharging a bit line by supplying a first precharge voltage to the bit line and supplying a second precharge voltage to a common source line so that the second precharge voltage is supplied to the bit line through a memory string;
supplying operating voltages to the memory string; and
sensing a voltage of the bit line, wherein the voltage is changed according to the operating voltages and a threshold voltage of a memory cell included in the memory string.

12. The method of claim 11, further comprising latching data corresponding to the threshold voltage.

13. The method of claim 11, wherein the operating voltages are supplied to the memory string so that the second precharge voltage having a same voltage level with the first precharge voltage is supplied to the bit line through the memory string.

14. The method of claim 11, wherein the second precharge voltage having a higher level than the first precharge voltage is supplied to the common source line.

15. The method of claim 11, wherein during a precharge operation of the bit line performed for a read operation of the memory string, the first and second precharge voltages are supplied.

16. The method of claim 11, further comprising reading data stored in a memory cell of the memory string by detecting a shift in the voltage of the bit line.

17. A semiconductor memory device, comprising:
a memory string coupled between a common source line and a bit line; and
a precharge circuit configured to precharge the bit line by simultaneously supplying a first precharge voltage to the bit line through a page buffer detecting a shift in a voltage of the bit line and a second precharge voltage to the bit line through the common source line and the memory string, during a precharge operation.

18. The semiconductor memory device of claim 17, wherein the precharge circuit comprises:
a first precharge circuit configured to supply the first precharge voltage to the bit line through the page buffer; and
a second precharge circuit coupled to the common source line and configured to output the second precharge voltage.

* * * * *